(12) United States Patent
Gammel et al.

(10) Patent No.: US 8,754,542 B2
(45) Date of Patent: Jun. 17, 2014

(54) APPARATUS INCLUDING A GATE DRIVE CIRCUIT FOR SELECTIVELY PROVIDING POWER TO A POWERED DEVICE THROUGH MULTIPLE WIRE PAIRS

(75) Inventors: John Gammel, Austin, TX (US); John N. Wilson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 418 days.

(21) Appl. No.: 13/241,016

(22) Filed: Sep. 22, 2011

(65) Prior Publication Data

US 2013/0076133 A1 Mar. 28, 2013

(51) Int. Cl.
*H02J 4/00* (2006.01)
*H03K 17/687* (2006.01)

(52) U.S. Cl.
USPC .......................................... 307/31; 327/365

(58) Field of Classification Search
USPC .......................................... 307/31; 327/365
See application file for complete search history.

(56) References Cited

U.S. PATENT DOCUMENTS

| 7,849,333 | B2 | 12/2010 | Schindler |
| 7,915,755 | B2 | 3/2011 | Diab et al. |
| 2008/0256373 | A1 | 10/2008 | Diab |
| 2010/0007334 | A1 | 1/2010 | Apfel |
| 2010/0083022 | A1 | 4/2010 | Diab |
| 2010/0211806 | A1 | 8/2010 | Diab et al. |

*Primary Examiner* — Hal Kaplan
(74) *Attorney, Agent, or Firm* — Cesari & Reed LLP; R. Michael Reed

(57) ABSTRACT

A gate drive circuit includes a first gate terminal, a second gate terminal, and a driver circuit including an input and including an output coupled to the first gate terminal. The driver circuit is configured to provide a drive signal to the first gate terminal to control a first switch to selectively couple a first current path to a first wire pair of a network port. The gate drive circuit further includes a switch including a first terminal coupled to the output of the driver circuit, a second terminal coupled to the second gate terminal, and a control terminal responsive to a switch control signal to selectively couple the output of the driver circuit to the second gate terminal to control a second switch to selectively couple a second current path to a second wire pair of the network port.

20 Claims, 5 Drawing Sheets

APPARATUS INCLUDING A GATE DRIVE CIRCUIT FOR SELECTIVELY PROVIDING POWER TO A POWERED DEVICE THROUGH MULTIPLE WIRE PAIRS

FIELD

The present disclosure is generally related to power sourcing equipment devices for supplying power to powered devices through Ethernet cables.

BACKGROUND

Power Over Ethernet (POE), which is outlined in IEEE Std 802.3™-2005 clause 33 (the POE standard), refers to a technique for delivering power and data to an electronic device via Ethernet cabling. In a POE system, a power source (or sourcing) equipment (PSE) device provides a power supply via two of four wire pairs of an Ethernet cable to electronic devices, which may be referred to as powered devices or PDs. POE makes it possible to deliver power to attached powered devices without requiring each PD to have access to a power source. Such PDs may include voice over Internet protocol (VoIP) telephones, wireless routers, security devices, field devices to monitor process control parameters, data processors, and the like.

The POE standard specifies protocols for detecting a PD and for determining how much power to supply to the PD through the Ethernet cable. In particular, the PSE device performs a PD detection operation to determine whether the PD is attached before supplying power via the Ethernet cable. To perform the PD detection operation, the PSE device applies a DC voltage (within a range of 2.8 to 10 Volts DC) to one of the pairs of wires of the Ethernet cable and monitors a received current or a received voltage to detect a PD resistance within an expected range (e.g. between 19 and 26.5 K-ohms). The PSE device determines if a PD is connected to one of the ports of the PSE device using a Volt-Amp (VA) slope related to the PD's voltage/current signature. If the PSE device does not detect a valid resistance, the PSE device does not apply power to the Ethernet port. However, if the PSE device detects a valid signature (i.e., an expected resistance), the POE standard specifies that the PSE device may either supply a default power level to the PD or optionally perform a power classification operation to determine power requirements of the detected PD.

If the PSE device supports power classification, the PSE device may apply a classification voltage to the Ethernet port associated with the detected PD. Assuming that the PD supports classification, the PD produces a classification current for the device. The PSE determines the PD's power classification based on this classification current.

The POE Standard defines five classes having pre-determined power levels and defines an appropriate response for a PD to select its power level by providing a corresponding classification current. For example, a current draw of zero to four mA corresponds to class 0, which is also the default class for devices that do not support the optional POE classification. A current draw of 26 to 30 mA and of 36 to 44 mA corresponds to class 3 and class 4 devices, respectively. The POE standard specifies that the PSE provide a power supply of approximately 15.4 watts to devices of class 0, class 3 and class 4. A current draw of between 9 and 12 mA corresponds to a class 1 device, and the POE standard specifies that the PSE provide a power supply of up to approximately 4 watts to a class 1 device. A class 2 device corresponds to a current draw of 17 to 20 mA and requires the PSE to provide approximately 7 watts of power.

In 2009, the Institute of Electrical and Electronics Engineers or IEEE adopted an updated version of the POE Standard, which is referred to as the IEEE 802.3 at-2009 PoE standard, "POE+" or "POE plus". POE plus provides an enhanced power classification that allows the PSE device to supply up to 25.5 watts of power, but does not comprehend a PSE device or PD using all four pairs of wires of the network cable for power.

SUMMARY

In an embodiment, a gate drive circuit includes a first gate terminal, a second gate terminal, and a driver circuit having an input and having an output coupled to the first gate terminal. The driver circuit is configured to provide a drive signal to the first gate terminal to control a first switch to selectively couple a first current path to a first wire pair of a network port. The gate drive circuit further includes a switch including a first terminal coupled to the output of the driver circuit, a second terminal coupled to the second gate terminal, and a control terminal responsive to a switch control signal to selectively couple the output of the driver circuit to the second gate terminal to control a second switch to selectively couple a second current path to a second wire pair of the network port.

In another embodiment, a port controller circuit includes a first current flow path, a second current flow path, a sense resistor, and a gate drive circuit. The first current flow path includes a first current electrode coupled to a first pair of terminals of a network port, and a second current electrode. The second current flow path includes a first current electrode coupled to a second pair of terminals of the network port, and a second current electrode. The sense resistor includes a first terminal coupled to the second electrodes of the first and second current flow paths, and a second terminal coupled to a power supply terminal. The gate drive circuit is coupled to the first current flow path, the second current flow path, and the sense resistor. The gate drive circuit is configured to control the first current flow path to provide a first current to the first pair of terminals and to control the second current flow path to selectively provide a second current to the second pair of terminals.

In still another embodiment, a power sourcing equipment (PSE) device includes a resistor having a first terminal and having a second terminal coupled to a power supply terminal. The PSE device further includes a network port configurable to couple to a network cable and including a plurality of terminals, which includes a first pair of terminals and a second pair of terminals. The PSE device also includes first and second transformers. The first transformer includes a primary winding and a secondary winding. The secondary winding includes a first electrode coupled to a first terminal of the first pair of terminals, a center tap, and a second electrode coupled to a second terminal of the first pair of terminals. The second transformer includes a primary winding, and a secondary winding including a first electrode coupled to a first terminal of the second pair of terminals, a center tap, and a second electrode coupled to a second terminal of the first pair of terminals. The PSE device also includes a first transistor and a second transistor. The first transistor includes a first current electrode coupled to the center tap of the first transformer, a control terminal, and a second current electrode coupled to the first terminal of the resistor. The second transistor includes a first current electrode coupled to the center tap of the second transformer, a control terminal, and a second current electrode coupled to the first terminal of the resistor. The PSE device further includes a gate drive circuit including a first output coupled to the control terminal of the first transistor, a second output couple to the control terminal of the second transistor, and a feedback input coupled to the first terminal of the resistor. The gate driver circuit controls the first transistor to couple a first current path to the center tap of the first transformer and controls the second transistor to selectively couple a second current path to the center tap of the second transformer.

BRIEF DESCRIPTION OF THE DRAWINGS

In the following discussion, the same reference numerals are reused to indicate the same or similar elements in different figures.

DETAILED DESCRIPTION OF ILLUSTRATIVE EMBODIMENTS

Figure 1:
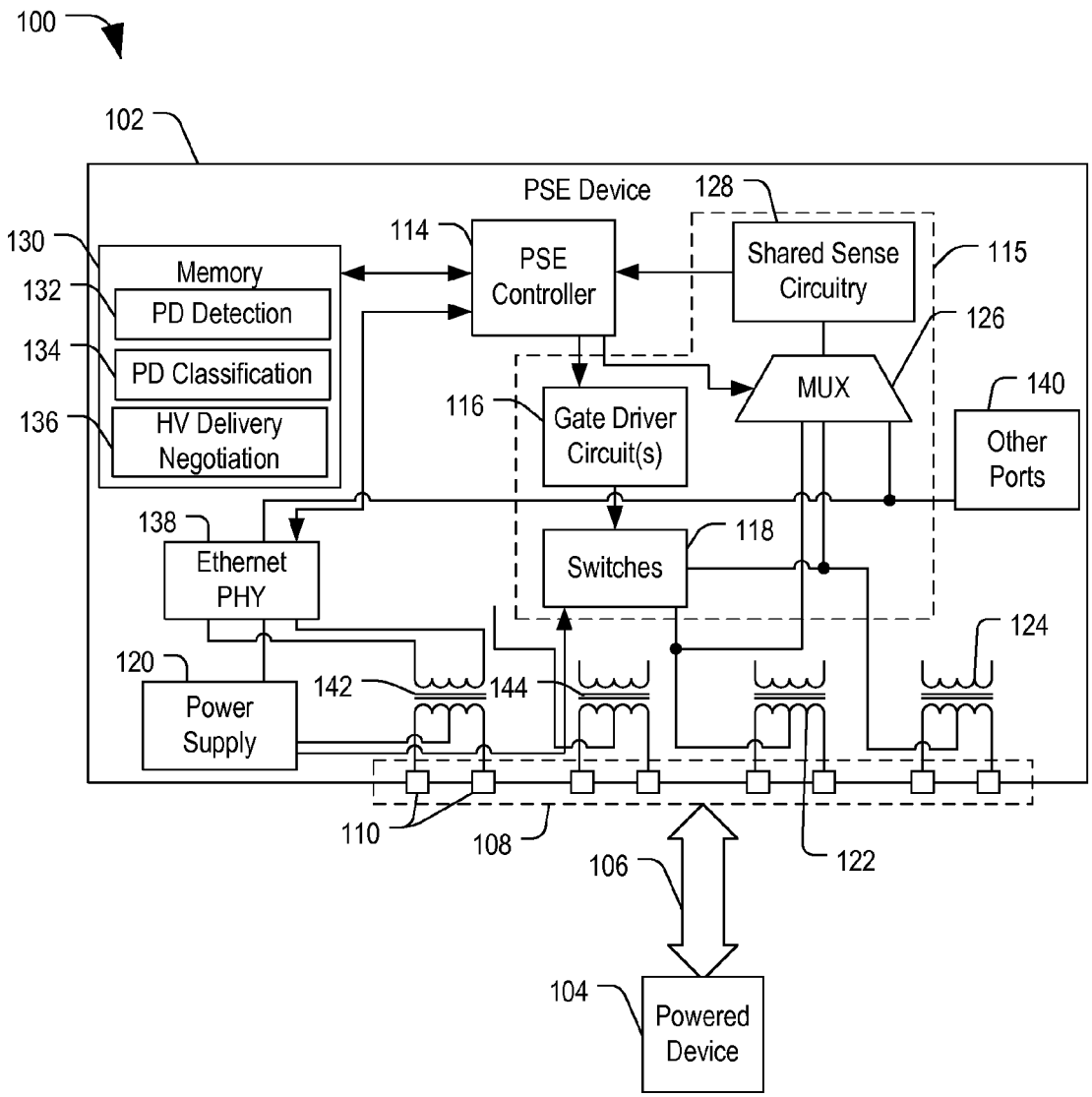
FIG. 1 is a block diagram of an embodiment of a POE system including a PSE device coupled to a powered device through a network cable.

Embodiments of a PSE device, a port controller circuit of the PSE device, and a gate driver circuit of the port controller circuit are described below that are configured to selectively provide a power supply to a PD through all four wire pairs of a network cable. In an example, the PSE device can supply up to sixty watts of power to a powered device through a single network port by providing power through two wire pairs concurrently while providing return current flow paths through the other two wire pairs.

In order to drive current onto two wire pairs, two driver circuits could be used to independently control a pair switches to selectively couple the return current flow path to one or more of the twisted pair wires of an Ethernet cable. In an example, two separate drivers are used to provide first and second supplies to different wire pairs of the same Ethernet cable to provide power to a powered device coupled to the other end of the cable. Further, sense circuitry may be provided for sensing currents and/or voltages flowing into or from a given port. If power is supplied to multiple wire pairs and/or if multiple return current flow paths are provided, multiple sense circuits may be desirable. However, it is possible to provide such powering and sensing capabilities with shared driver circuitry and shared sense circuitry, respectively.

In an example, a PSE device having twelve ports can be implemented with shared detection and classification circuitry multiplexed over a number of ports. In a particular instance, the shared circuitry can be duplicated three times and each instance of the shared circuitry can be multiplexed over four of the twelve ports. The PSE device has a detection and classification cycle that is short enough that one port controller circuit can perform powered device detection and classification for four ports in less than 400 msec. Also, in an embodiment, a single analog-to-digital converter is multiplexed across the twelve ports.

Further, by providing an auxiliary FET for each port, the PSE can supply power to two wire pairs of each port and provide return current flow paths via the other two wire pairs. Depending on the implementation, the PSE can supply power to the powered device over all four wire pairs. In some instances, the PSE includes a port control circuit with two independent gate drive circuits, which uses less silicon area than multiplexing each individual gate drive so that it could connect to multiple switching field effect transistors (FETs).

In embodiments described below with respect to FIGS. 1-6, a gate driver is configured to selectively control switches (such as switches 118) or drive the gates of a first FET and an auxiliary FET (such as the gates of transistors 336 and 338 in FIG. 3) to selectively provide first and second current flow paths to first and second wire pairs of a particular network port. Further, sense circuitry can be shared across the FETs and/or across multiple network ports. An example of a POE system including a PSE device having shared gate driver and shared sense circuits is described below with respect to FIG. 1.

FIG. 1 is a block diagram of an embodiment of a POE system 100 including a PSE device 102 coupled to a PD 104 through a network cable 106. The network cable 106 is an Ethernet cable having multiple (four) twisted pairs of wires. PSE device 102 includes a port 108, which includes multiple terminals 110 for coupling to the twisted pair wires of network cable 106. PSE device 102 includes a plurality of transformers 142, 144, 122, and 124, each of which includes a primary winding (which has first and second terminals that may be coupled to a transceiver, such as Ethernet PHY 138) that is inductively coupled to a secondary winding (which has first and second terminals coupled to pairs of the twisted pair wiring of network cable 106 through corresponding pairs of the multiple terminals 110). Further, each of the secondary windings of transformers 122, 124, 142, and 144 is provided with a center tap. In this example, the power supply 120 can be an electrical ground that is connected to the center taps of transformers 142 and 144. Further, the switches 118 are connected to the center taps of transformers 122 and 124. This particular configuration makes it possible to provide a voltage potential, for example, between the center tap of transformer 142 and the return current flow path provided by the center tap of transformer 122 and an associated one of switches 118, that is approximately 30V by coupling the selected switch to a power supply that at a potential that is negative relative to ground.

PSE device 102 includes a PSE controller 114 coupled to Ethernet PHY 138, to a memory 130, and to a port controller circuit 115. PSE device 102 further includes a power supply 120 coupled to the port controller circuit 115 and to center taps of transformers associated with other ports 140, which may be coupled to one or more other PDs.

Port controller circuit 115 includes gate driver circuitry 116, which includes one or more gate drivers where each gate driver is configured to drive one of the switches 118 associated with a particular port, such as port 108 or other ports 140. Switches 118 include second current electrodes coupled to power supply 120, control inputs coupled to gate driver circuitry 116, and first current electrodes coupled to center taps of the secondary windings of transformers 122 and 124 and to center taps of transformers associated with other ports 140. Port controller circuit 115 further include a multiplexer including a plurality of inputs coupled to the outputs of switches 118, a selection input coupled to PSE controller 114, and an output coupled to shared sense circuitry 128, which has an output coupled to PSE controller 114.

Memory 130 includes instructions including PD detection instructions 132 that, when executed by PSE controller 114, cause the PSE controller 114 to apply a signal to a selected port and to determine a resistive signature of a device coupled to the network port in response thereto to detect the presence of a POE-enabled electronic device coupled to the other end of the network cable 106. Memory 130 further includes instructions including PD classification instructions 134 that, when executed by PSE controller 114, cause the PSE controller 114 to apply signals to the selected port and measure the response to determine a power classification for the electronic device coupled to the port. Memory 130 also includes high voltage (HV) delivery negotiation instructions 136 that, when executed by PSE controller 114, cause the PSE controller 114 to utilize Ethernet PHY 138 to negotiate with the PD 104 to determine whether the PD 104 can receive power over multiple pairs of the network cable 106. Depending on the results of the interaction, PSE controller 114 communicates with port controller circuit 115 to selectively provide power to the center taps of at least one of transformers 142 and 144 to supply power to multiple wire pair via port 108 and to selectively activate a respective one or more switches 118 to provide return current paths via the center taps of one or more of the transformers 122 and 124.

In an example, port controller circuit includes a first current flow path (through a primary one of switches 118) coupled to the first pair of terminals of a network port and a second current flow path (though an auxiliary one of switches 118) to a second pair of terminals. The port controller circuit further includes a sense resistor, such as resistor 408 in FIG. 4, including a first terminal coupled to the first and second current flow paths and a second terminal coupled to a power supply terminal, such as ground. The gate drive circuit 116 is coupled to the first current flow path, the second current flow path, and the sense resistor, and is configured to control the first current flow path to provide a first current to the first pair of terminals and to control the second current flow path to selectively provide a second current to the second pair of terminals.

In an example, PSE controller 114 controls port controller circuit 115 to perform powered device detection and classification operations to detect and classify PD 104 coupled to network port 108 by network cable 106. After detection and classification, PSE controller 114 controls Ethernet PHY 138 to communicate with PD 104 through network cable 106 to query whether PD 104 can support power delivery over multiple wires. If so, PSE controller 114 controls switches 118 (both primary and auxiliary) to deliver power to the center taps of transformers 122 and 124 substantially concurrently, thereby delivering power to PD 104 through two different wire pairs. In some instances, PSE controller 114 controls port controller circuit 115 to deliver power to PD 104 while the PSE device 102 and the PD 104 are negotiating enhanced power levels via Ethernet communications.

Further, PSE controller 114 selectively controls a channel of multiplexer 126 to provide a sensed signal from the output of switches 118 to shared sense circuitry 128, which communicates the sensed signals to PSE controller 114, providing a feedback loop through which power delivered to port 108 can be detected and adjusted. Gate driver circuitry 116 can be used to drive multiple switches (not shown) to supply power to multiple wire pairs through center taps of transformers 142 and 144. Further, gate driver circuitry 116 can be used to drive multiple switches 118 to provide return current flow paths through transformers 122 and 114. In an example a single gate driver circuit is provided for each port (such as port 108), and at least two switches 118 are provided for each port (one switch to supply power to a center tap of a first transformer and a second switch to supply power to a center tap of a second transformer).

Figure 2:
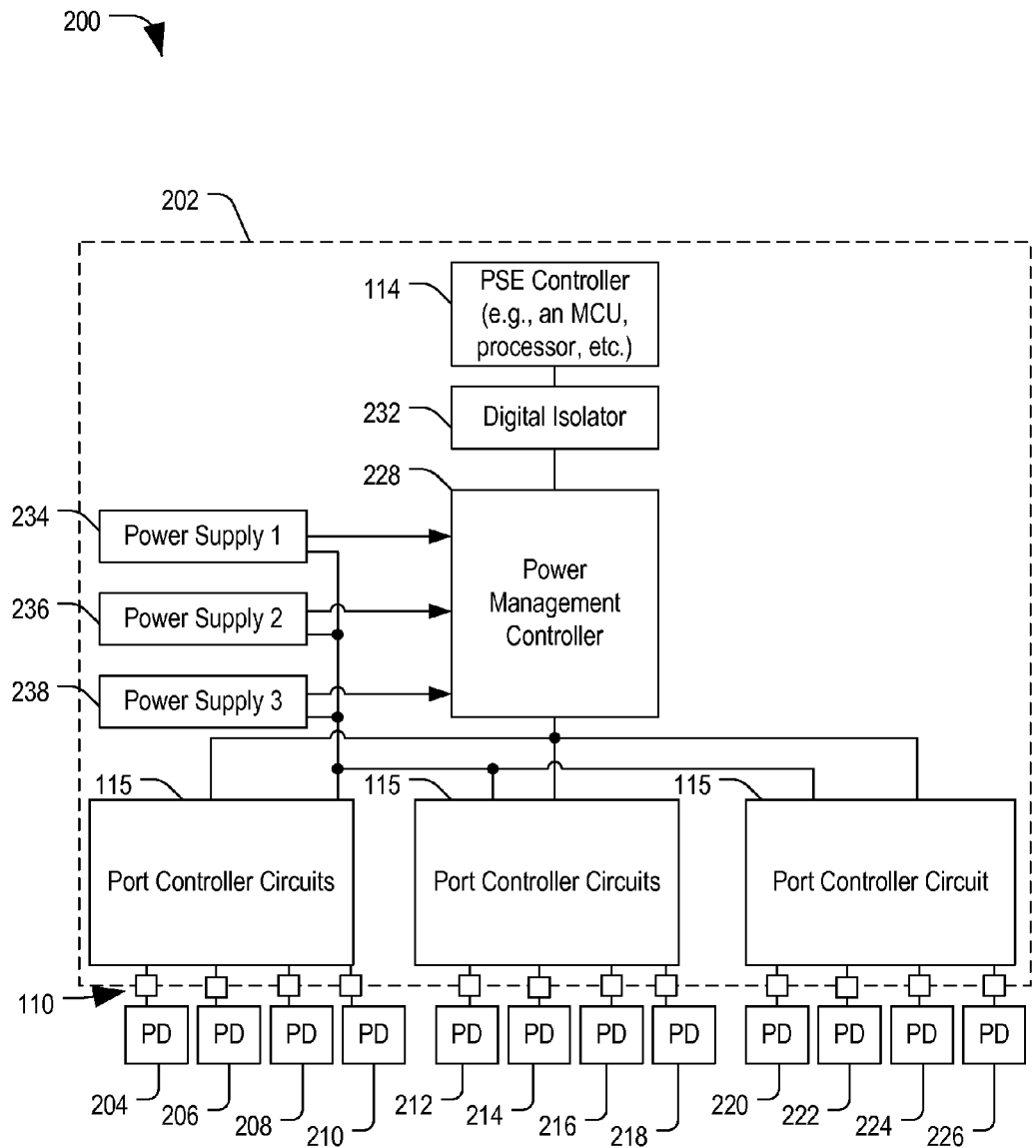
FIG. 2 is a block diagram of a POE system including a second embodiment of a PSE device including a port controller circuit configured to supply power to a plurality of powered devices.
Figure 3:
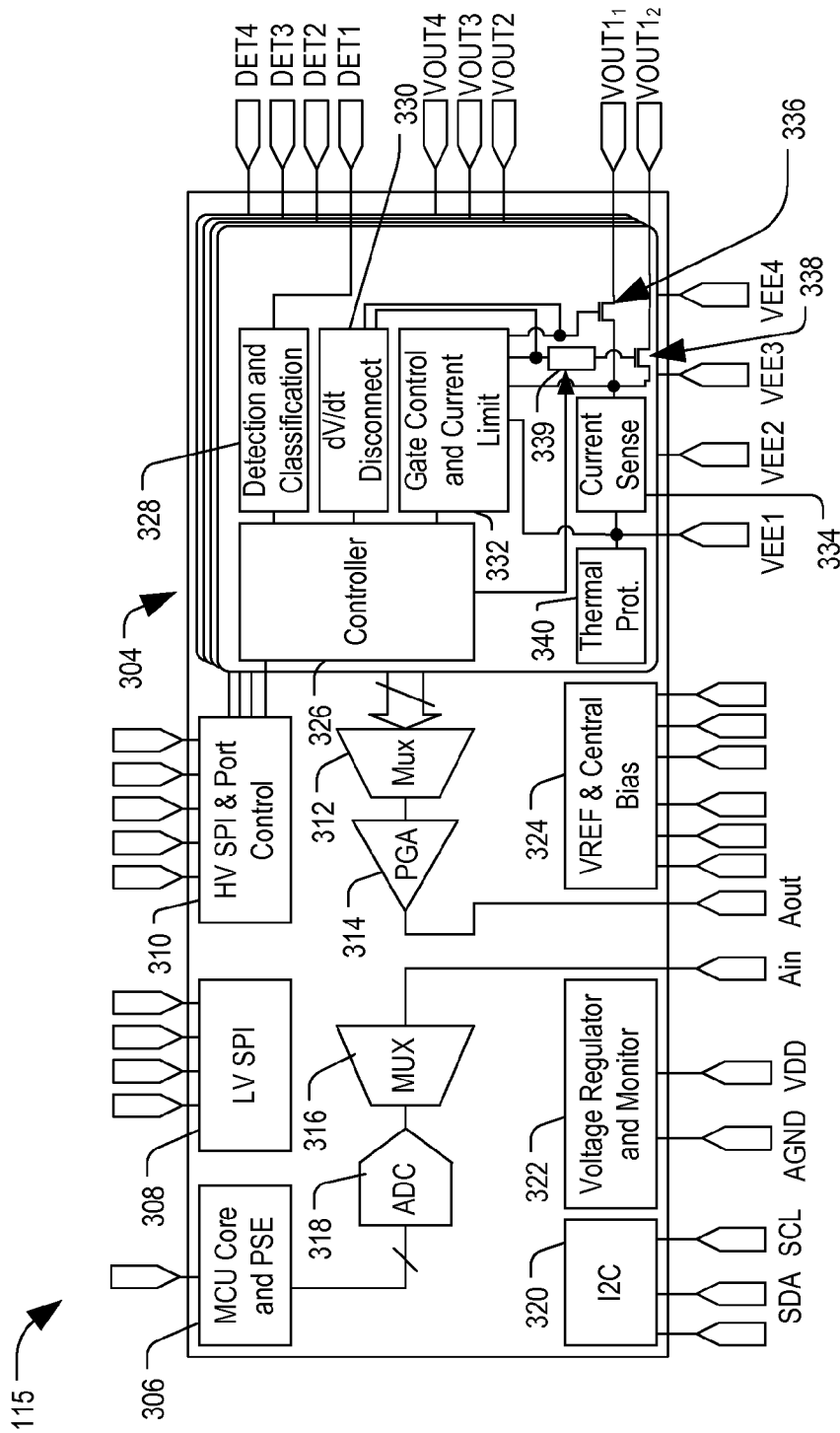
FIG. 3 is a block diagram of an embodiment of the port controller circuit of the PSE devices of FIGS. 1 and 2 for selectively providing power to a powered device through multiple wire pairs.

While the illustrated example of FIG. 1 depicts a PSE controller 114 for controlling the port control circuit 115, in other embodiments, a separate controller may be provided (such as high voltage serial peripheral interface and port control circuit 310 in FIG. 3) for controlling the port control circuit 115. In some instances, each port control circuit 115 may include its own control circuit, such as controller 326 in FIGS. 3-6. In the examples of FIGS. 2-6, the PD detection and classification operations and, optionally, the high voltage delivery negotiation operations can be performed by the port control circuit 115, and the results may be communicated to the PSE controller 114. Further, while the illustrated example depicts port 108 and other ports 140, an example of a system including a PSE device having twelve ports and three port controllers is described below with respect to FIG. 2.

FIG. 2 is a block diagram of an embodiment of a system 200 including a power source equipment (PSE) device 202 configured to supply power to a plurality of PDs 204, 206, 208, 210, 212, 214, 216, 218, 220, 222, 224, and 226. PSE device 202 includes a PSE controller 114, such as a micro control unit (MCU) or host controller coupled to a power management controller 228 through a digital isolator 232. Power management controller 228 is coupled to port controller circuits 115 and to power supplies 234, 236, and 238. Port controller circuits 115 are also coupled to power supplies 234, 236, and 238. Each port controller circuit 115 is coupled to four ports 110, which may be coupled to respective number of the PDs. As discussed in FIG. 1, each port controller circuit 115 includes gate drive circuits 116 and switches (such as switches 118) for selectively providing return current flow paths from a selected one of the PDs 204, 206, 208, 210, 212, 214, 216, 218, 220, 222, 224, and 226 through one or two pairs of wires. In a particular embodiment, PSE controller 114, digital isolator 232, power management controller 228 and port controller circuits 115 may be formed on a single substrate or alternatively may be formed as an integrated circuit.

In an example, each of the port controller circuits 115 is configured to detect a PD connected to a port by performing a PD detection process and to determine a power classification for a connected PD using a PD classification process. Further, each of the port controller circuits 115 is configured to determine whether a PD requires additional power above that allowed under the POE Standard or even the POE plus Standard, i.e., above, for example, 30 Watts. In an example, each port controller circuit 115 includes multiple switches (such as switches 118), which can be independently biased by one or more gate driver circuits to provide current to different pairs of twisted pair wires of an Ethernet cable, making it possible for the port controller to deliver power to a selected PD through more than one pair of wires of the network cable concurrently.

In an example, port controller circuit 115 detects PD 204 using a PD detection process and classifies the power requirements using a PD power classification process defined by the POE Standard. After successfully classifying the PD 204 and optionally after supply power to the PD 204 according to the PD power classification, port controller circuit 115, PSE controller 114, and/or power management controller 228 can control the Ethernet PHY 138 to perform a high voltage delivery negotiation process whereby Ethernet packets are exchanged with the PD 204 via auxiliary wire pairs of the network cable to determine whether PD 204 is capable of receiving power over more than one twisted wire pair. If the PD 204 can receive an enhanced power supply through additional wire pairs, PD 204 responds to the Ethernet packets from PSE device 202 to communicate its auxiliary power requirements. Thus, PSE device 202 and PD 204 can negotiate power delivery using data packets to determine a power level to be supplied to PD 204. Once negotiated, port controller circuit 115 uses gate drive circuit 116 and the switches 118 to selectively provide a first power supply to a first wire pair of twisted pair wires of a network cable and to selectively provide a second power supply to a second wire pair of the twisted pair wires and to selectively provide first and second current flow paths through third and fourth wire pairs of the twisted pair wires of the network cable for the return current. In one instance, the first and second power supplies are the same, doubling the power supplied to the PD 204 through the auxiliary (second) wire pair. In another instance, the first and second power supplies can be different to provide a total power supply that is greater than approximately 30 Watts, for example.

While in the illustrated example the port controller circuit 115 depicted in FIGS. 1 and 2 is depicted in a simplified form including only some of the elements of the circuit, port controller circuit 115 may include additional circuitry, such as a shared analog-to-digital converter, a micro control unit (MCU), and other circuitry. An example of one possible implementation of a port controller circuit is described below with respect to FIG. 3.

FIG. 3 is a block diagram of an embodiment of port controller circuit 115 of PSE devices 102 and 202 of FIGS. 1 and 2 for selectively providing power to a powered device through multiple wire pairs. Port controller circuit 115 includes a plurality of port drive circuits 304, which are configured to couple to wires of a twisted pair network cable through additional circuitry, such as a transformer, which, in this embodiment, is an external component. Port controller circuit 115 includes a controller 306, such as an MCU CORE and PSE control circuit, which controls operation of the port controller circuit 115. Controller 306 includes an input/output coupled to a terminal for communicating with other circuitry. Further, controller 306 includes an input coupled to an output of an analog-to-digital converter (ADC) 318, which can provide a multi-bit output to controller 306. ADC 318 includes an input coupled to an output of a multiplexer 316, which has an input coupled to an analog input (Ain) terminal.

Port controller circuit 115 further includes a low voltage serial peripheral interface (LV SPI) 308 coupled to multiple terminals for communicating with one or more circuits and includes a high voltage serial peripheral interface (HV SPI) and port control circuit 310 coupled to multiple terminals for communicating with one or more circuits. HV SPI and port control circuit 310 is connected to each of the port drive circuits 304. Each of the port drive circuits 304 are coupled to at least one input of a multiplexer 312, which has an output coupled to an input of a programmable gain amplifier (PGA) 314, which has an output coupled to an analog output (Aout) terminal.

Port controller circuit 115 includes an inter-integrated circuit (I2C) interface 320 coupled to serial data (SDA) and serial clock (SCL) terminals and configured to communicate with other circuits. Further, port controller circuit 115 includes a voltage regulator and monitor 322, which is coupled to an analog ground (AGND) terminal and a power supply terminal (VDD). Further, port controller circuit 115 includes a voltage reference and central bias circuit 324, which is coupled to multiple terminals.

Each of the port drive circuits 304 includes a controller 326, which may perform both channel mode and current limit control functions. Controller 326 includes an input coupled to the HV SPI and port control circuit 310 for receiving control signals. Further, controller 326 is coupled to a detection and classification circuit 328, a disconnect detection circuit (dV/dt Disconnect) 230, and a gate control and current limit circuit 332. Gate control and current limit circuit 332 includes gate driver 116 from FIG. 1.

In this example, port controller circuit 115 includes four port drive circuits 304, each of which has a detection terminal (DET1, DET2, DET3, or DET4), a power supply terminal (VEE1, VEE2, VEE3, and VEE4), and output voltage terminals (such as $VOUT1_1$ and $VOUT1_2$). The first and second output voltage terminals $VOUT1_1$ and $VOUT1_2$ are illustrated, but, for simplicity, only one output voltage terminal (VOUT2, VOUT3, and VOUT4) are shown for the other port drive circuits. In some embodiments, each port drive circuit 304 may include up to two output voltage terminals and two return current terminals (e.g., $VOUT1_1$ and $VOUT1_2$) with a corresponding number of switches, such as primary transistor 336 and auxiliary transistor 338. Primary transistor 336 has a first current electrode coupled to the first output voltage terminal $VOUT1_1$, a control terminal coupled to gate control and current limit circuit 332, and a second current electrode coupled a first terminal of a current sense circuit 334 and to a feedback terminal of gate control and current limit circuit 332. Current sense circuit 334 has a second terminal coupled to a power supply terminal (VEE1) and to thermal protection circuit 340. Auxiliary transistor 338 has a first current electrode coupled to the second output voltage terminal $VOUT1_2$, a control terminal coupled to a switch 339, which is coupled to gate control and current limit circuit 332, and a second current electrode coupled to the first terminal of the current sense circuit and to a feedback input of gate control and current limit circuit 332. In this instance, gate control and current limit circuit 332 includes gate drive circuit 116 to selectively drive the control terminals (i.e., gates) of primary transistor 336 and auxiliary transistor 338. Switch 339 includes a control input coupled to controller 326. In an alternative embodiment, gate control and current limit circuit 332 can include control logic that is coupled to the control input of switch 339. Further, each port drive circuit 304 includes thermal protection circuit 340 for detecting when the port drive circuit 304 is overheating and to shut down sensitive circuitry in response to detecting an overheating condition.

Detection and classification circuit 328 includes an input coupled to a detection terminal DET1. Disconnect detection circuit 330 includes inputs connected to the control terminals of primary transistor 336 and auxiliary transistor 338 and to the first terminal of current sense circuit 334. Disconnect detection circuit 330 is also connected to channel mode and limit control circuit 326.

In an example, HV SPI and port control circuit 310 sends a signal to controller 326 to trigger gate control and current limit circuit 332 to activate primary transistor 336 to provide a return current flow path to receive a PD device signature from the voltage output terminal $VOUT1_1$, which is coupled to a center tap of a transformer having a first terminal coupled to a first wire of a wire pair and a second terminal coupled to a second wire of the wire pair of a twisted pair network cable. The PD device signature is received in response to a PD detection signal supplied by detection and classification circuit 328. The PD detection signal is a voltage within a range of 2.8 volts to 10 volts. Detection and classification circuit 328 uses current sense circuit 334 to detect a signal in response to the PD detection signal to determine whether a PD is coupled to a selected port. If the detected signal corresponds to a device signature having a resistance of approximately 19 kΩ to 26.5 kΩ, controller 326 controls detection and classification circuit 328 to apply a PD classification signal to the detection terminal (DET1), which is coupled to the center tap of one of the transformers (such as transformer 142 in FIG. 1). Detection and classification circuit 328 uses current sense 334 to sense a PD classification signal and determines the power requirements of the PD based on the sensed signal. In this example, detection and classification circuit 328 performs PD detection and classification operations on the primary current flow path associated with primary transistor 336, and not a current flow path associated with the auxiliary transistor 338.

Port controller 304 may communicate the power requirement data to an output coupled to multiplexer 312, making the data accessible to other circuitry. After classification and after providing power to the port by activating primary transistor 336, controller 326 can communicate with the PD device using Ethernet frames transmitted on the Ethernet cable to determine whether the PD can receive power over more than two wire pairs. If the controller 326 determines that the PD is capable of receiving power over auxiliary wire pairs, the controller 326 can supply power to another transformer, such as transformer 144 in FIG. 1, and controls gate control and limit circuit 332 and switch 339 to bias auxiliary transistor 338 to provide a second return current flow path via the center tap of a second transformer, such as transformer 124 in FIG. 1, via output terminal $VOUT1_2$.

Figure 4:
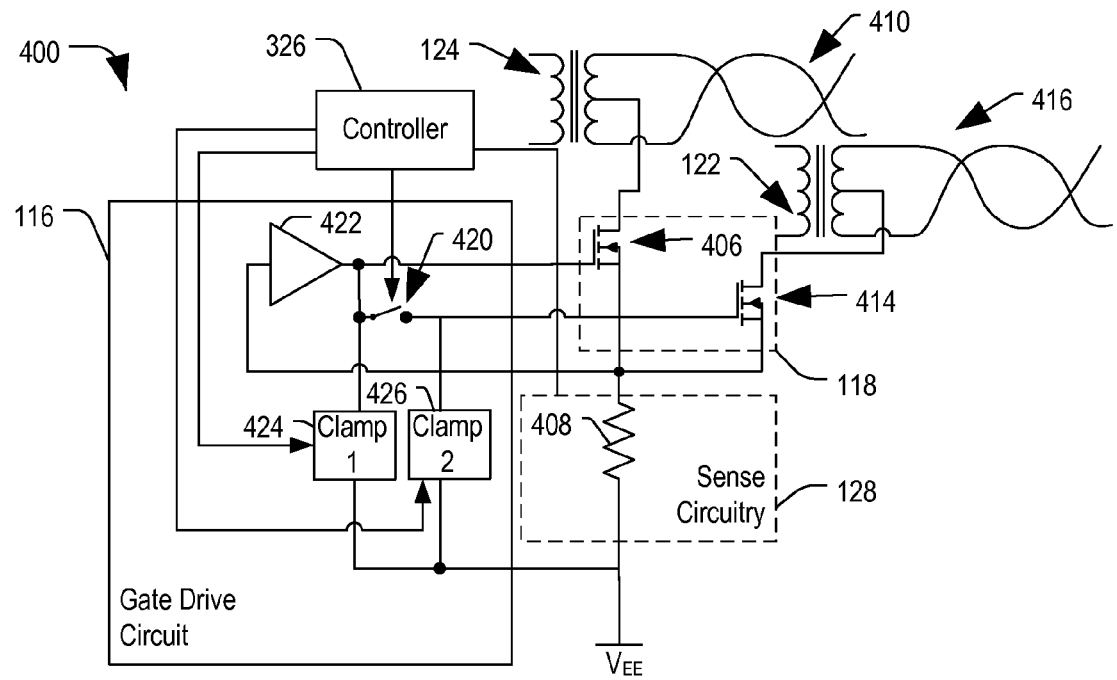
FIG. 4 is a partial block diagram and partial circuit diagram of an embodiment of a portion of the port controller circuit including the gate driver circuit and switches of FIG. 3 for providing power through first and second current paths.

FIG. 4 is a partial block diagram and partial circuit diagram of an embodiment of a portion of the port controller circuit 400, such as port controller circuit 304 of FIG. 3. Port controller circuit 400 includes controller 326 coupled to sense circuitry 128, and to a gate drive circuit 116. Gate drive circuit 116 is coupled to switches 118, which have a first output coupled to a center tap of a secondary winding of transformer 124 for providing power to a first twisted wire pair 410 and a second output coupled to a center tap of a secondary winding of transformer 122 for providing power to a second twisted wire pair 416 coupled to port 110.

Switches 118 include a first transistor 406 having a first current electrode coupled to the first output, a control electrode, and a second current electrode coupled to a first terminal of a resistor 408 (which is part of the sense circuitry), which has a second terminal coupled to ground. Switches 118 further include a second transistor 414 having a first current electrode coupled to the second output, a control electrode, and a second current electrode coupled to the first terminal of resistor 408.

Gate driver circuit 116 includes a driver 422 having an input coupled to the first terminal of resistor 408 and an output coupled to the control electrode of first transistor 406. Gate driver circuit 116 further includes a switch 420 including a first terminal coupled to the output of driver 422 and a second terminal coupled to the control electrode of second transistor 414. Switch 420 includes a control terminal coupled to controller 326 and is responsive to control signals from controller 326 to couple the driver output signal to the control electrode of transistor 414. Gate drive circuit 116 also includes a first clamp circuit 424 and a second clamp circuit 426. First clamp circuit 424 includes a first terminal coupled to the first terminal of switch 420, a second terminal coupled to ground, and a control terminal coupled to controller 326 for receiving control signals. Second clamp circuit 426 includes a first terminal coupled to the second terminal of switch 420, a second terminal coupled to ground, and a control terminal coupled to controller 326.

In an example, first transistor 406 is turned on by releasing first clamp 424 and enabling the driver 422, which may be implemented as an operational amplifier. Driver 422 limits inrush current. The second clamp circuit 426 keeps the drive signal from reaching the control electrode of transistor 414, thereby keeping transistor 414 in an "off" mode.

When the first transistor 406 is fully on and controller 326 decides to activate the second transistor 414, controller 326 releases the second clamp 426, and closes switch 420 to couple the output of the driver 422 to the control electrode of transistor 414. The current limit threshold of the driver 422 would also be increased to allow a larger amount of current to flow through the combination of the two transistors 406 and 414, as measured across sense resistor 408.

In one instance, when the FET is turned on, there may be an inrush current that can be controlled on the PD side. In another instance, driver 422 may dynamically alter the bias applied to the control electrode of transistor 406 to limit current through transistor 406 while the inrush current is present at the second transistor 414. In the case of a fault after the inrush period, gate control and current limit circuit 332 would provide some fault protection. If the fault only occurs on one wire pair, one transistor (i.e., transistor 406 or 414) would carry the majority of the fault current. In this instance, fault protection can be provided under MCU control, such as by controller 114 or HV SPI and port control circuit 310 (in FIG. 3).

In the illustrated example, sense circuitry 128 is depicted in phantom because other circuitry in addition to sense resistor 408 is included in the sense circuitry, such as comparators, threshold detectors, decision logic, and the like. A single sensor resistor 408 is provided to provide a sense voltage based on the current at the port (regardless of whether transistor 406 and/or transistor 414 is turned on) because sense resistor 408 makes it possible to measure the total current, even if the current is not divided evenly between the transistors 406 and 414. While it may be desirable to have matched transistors 406 and 414 to balance the current in case of an overload, in some instances, the transistors 406 and 414 may not be matched. Further, in some instances, it may be desirable to deliberately control the bias currents to apply different currents to the different twisted wire pairs.

In the illustrated example of FIG. 4, port controller circuit 400 avoids coupling to the drain connection for the transistors 406 and 414 for detection. In this instance, the sense resistor 408 is used to detect and classify the PD via the first wire pair (e.g., transistor 406) and then power is provided via transistor 406. The PSE then negotiates with the PD about providing power using others of the twisted pair wires. In a particular instance, the PSE uses an Ethernet transceiver (such as Ethernet PHY 138 in FIG. 1) to transmit packets on one of the other pairs of wires to insure that the PD and PSE are really connected on both wire pairs and to initiate negotiations. In one instances, the negotiation may include a query from the PSE to the PD regarding capabilities and/or power requirements of the PD and an acknowledgement from the PD to the PSE specifying the PD's capabilities and power requirements and completing the negotiation regarding power. If the negotiation is successful, the PSE can apply power to the other wire pair. By utilizing a single sense resistor 408 to monitor current flow through transistors 406 (first current flow path) and auxiliary transistor 414 (second current flow path), the total current can be measured even if the current does not divide evenly between the current flow paths.

Figure 5:
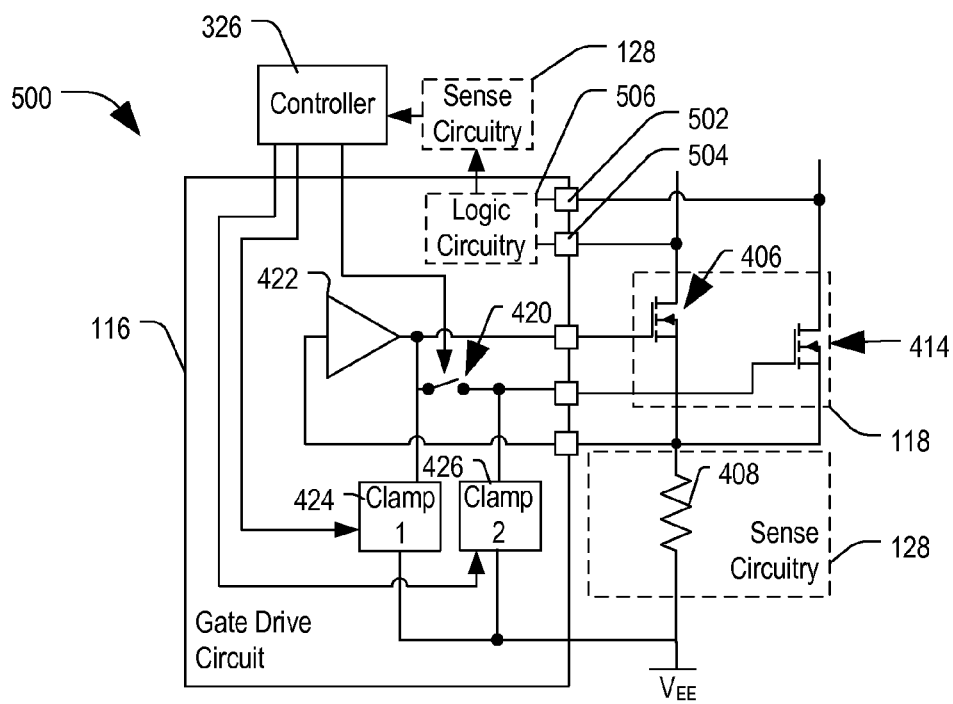
FIG. 5 is a partial block diagram and partial circuit diagram of a second embodiment of a portion of the port controller circuit of FIG. 4 providing power through first and second current paths and including additional terminals for sense circuitry.

While the example of FIG. 4 provides only one feedback input coupled to the first terminal of the sense resistor 408, it may sometimes be desirable to detect a PD device signature specific to the secondary or auxiliary wire pair. An example of a second embodiment of the circuit is described below with respect to FIG. 5 that includes a sense path for the auxiliary port:

FIG. 5 is a partial block diagram and partial circuit diagram of a second embodiment of a portion of a port controller circuit 500, such as port controller circuit 304 of FIG. 3, including additional terminals 502 and 504 for sense circuitry. Port controller circuit 500 includes a gate driver circuit 116, which is the same as port controller circuit 116 described in FIG. 4, except that it includes logic circuit block 506 and two additional feedback terminals, including a first feedback terminal 502 coupled to the first current electrode of transistor 406 and a second feedback terminal 504 coupled to the first current electrode of transistor 414. These additional feedback terminals provide sense paths for both the primary and auxiliary transistors 406 and 414, respectively, making it possible to provide physical layer signature detection for the first wire pair and the second wire pair independently.

In this example, sense circuitry 128 is depicted as including two portions that are external to gate drive circuit 116 because sense circuitry 128 may be distributed. Further, sense circuitry 128 includes an input coupled to an output of logic circuit 506, which has inputs coupled to first and second feedback terminals 502 and 504.

In an embodiment, the sense circuitry 128 may be shared by multiple gate drive circuits. In a particular example, referring to FIG. 3, the controller of gate drive circuit 116 can provide the analog signals or data related to the signals on the first electrodes of transistors 406 and 414 (received from feedback terminals 502 and 504) to one or more inputs of multiplexer 312.

In general, port controller circuits 115 in FIGS. 1-3 and the portions of the port controller circuits 400 and 500 in FIGS. 4 and 5 are operable to selectively provide up to 30 Watts of power onto a first pair of wires associated with a given port and to concurrently provide up to an additional 30 Watts of power over an alternate pair of wires associated with the given port, providing a total power supply of up to approximately 60 Watts over four wires. Further, the port controller includes gate driver circuitry to selectively couple return current flow paths wire pairs of the twisted wire cabling, providing a complete circuit for supply power via more than one pair of wires. Further, in this embodiment, sense circuitry 128 is shared to sense current consumption by the powered device of up to 60 Watts of power or higher.

While the examples of FIGS. 4 and 5 depicted a single gate drive circuit 116 and 116, respectively, the port controller circuit 115, 400, or 600 can be used to control multiple ports and can include a gate drive circuit 116 for each port. An example of a circuit for sharing the sense circuitry 128 across multiple ports is described below with respect to FIG. 6.

Figure 6:
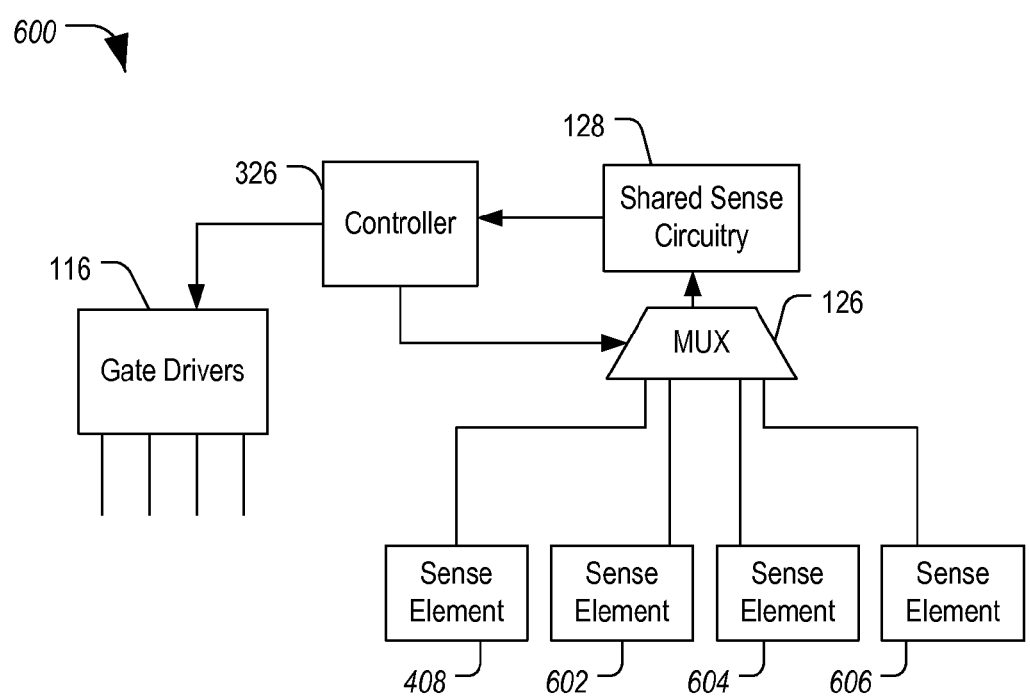
FIG. 6 is a block diagram of a portion of the port controller circuit of FIG. 3 adapted to selectively supply power to four ports and to selectively deliver the power to one or more wire pairs of each of the selected ports.

FIG. 6 is a block diagram of a portion of a port drive circuit 600 adapted to selectively supply power to four ports and to selectively deliver the power to one or more wire pairs of each of the selected ports. Port drive circuit 600 includes controller 326, which has a first output coupled to gate driver circuits 116, 116 and a second output coupled to a select input of a multiplexer 126. Multiplexer 126 includes multiple inputs including a first input coupled to sense element 408, a second input coupled to sense element 602, a third input coupled to sense element 604, and a fourth input coupled to sense element 606. Multiplexer 126 includes an output coupled to an input of shared sense circuitry 126, which has an output coupled to controller 326.

In this example, the connections from sense elements 408, 602, 604, and 606 to the inputs of multiplexer 126 are depicted as being direct connections; however, the signal paths may be indirectly connected to the inputs of the multiplexer 126 through terminals of the gate drive circuit 116 as previously described with respect to FIG. 5.

In conjunction with the circuits described above with respect to FIGS. 1-6, a circuit is described that includes a gate driver circuit that has an output coupled to the gate of a first transistor to selectively bias the first transistor to couple a power supply terminal (such as VEE) to a first wire pair of a network cable coupled to a port. The circuit includes a switch to selectively couple the output to the gate of an auxiliary transistor to concurrently couple the power supply terminal to a second wire pair of the network cable. Thus, a single gate drive circuit can be used to provide up to 60 Watts of power to a powered device over two pairs of wires of the network cable.

Further, a port drive circuit is disclosed that is configured to control power to multiple ports. The port drive circuit includes multiple gate driver circuits, one for each port of the multiple ports, and includes a shared sense circuit configured to measure signals for each port and/or for each wire pair.

Additionally, a PSE device is disclosed that includes multiple ports for supplying power to a plurality of PDs. The PSE device includes multiple port drive circuits for controlling power supplied to subsets of the multiple ports. In an example, a power management circuit is included that is coupled to each of the port drive circuits Although the present invention has been described with reference to preferred embodiments, workers skilled in the art will recognize that changes may be made in form and detail without departing from the scope of the invention.

What is claimed is:

1. A gate drive circuit comprises:
   a first gate terminal;
   a second gate terminal;
   a driver circuit including an input and including an output coupled to the first gate terminal, the driver circuit configured to provide a drive signal to the first gate terminal to control a first switch to selectively couple a first current path to a first wire pair of a network port;
   a switch including a first terminal coupled to the output of the driver circuit, a second terminal coupled to the second gate terminal, and a control terminal responsive to a switch control signal to selectively couple the output of the driver circuit to the second gate terminal to control a second switch to selectively couple a second current path to a second wire pair of the network port.

2. The gate drive circuit of claim 1, further comprising a switch control terminal configurable to couple to a controller for receiving the switch control signal.

3. The gate drive circuit of claim 1, further comprising:
   a feedback terminal coupled to the input of the driver circuit for detecting a current; and wherein the driver circuit reduces the drive signal to the first gate terminal and to the second gate terminal when the current exceeds an over-current threshold.

4. The gate drive circuit of claim 3, further comprising a sense resistor including a first terminal coupled to the feedback terminal and including a second terminal coupled to a power supply terminal.

5. The gate drive circuit of claim 4, wherein:
the first switch includes a first current electrode coupled to a first pair of terminals associated with a port, a control electrode coupled to the first gate terminal, and a second current electrode coupled to the first terminal of the sense resistor; and
the second switch includes a first current electrode coupled to a second pair of terminals associated with a port, a control electrode coupled to the first gate terminal, and a second current electrode coupled to the first terminal of the sense resistor; and
wherein the sense resistor is shared for a first current path through the first switch and a second current path through the second switch.

6. The gate drive circuit of claim 1, further comprising:
a first control terminal for receiving a first control signal;
a second control terminal for receiving a second control signal;
a first clamp including a first terminal coupled to the output of the driver circuit, a second terminal coupled to a supply terminal, and a control terminal coupled to the first control terminal;
a second clamp including a first terminal coupled to the second terminal of the switch, a second terminal coupled to the power supply terminal, and a control terminal coupled to the second control terminal; and
wherein the first clamp is responsive to the first control signal to disconnect the output of the driver circuit from the power supply terminal to allow the drive signal from the driver circuit to reach to the first gate terminal.

7. The gate drive circuit of claim 6, wherein the second clamp is responsive to the second control signal to disconnect the second terminal of the switch from the power supply terminal to deliver the gate drive signal from the driver circuit to the second gate terminal.

8. A port controller circuit comprising:
a first current flow path including a first current electrode configured to couple to a first pair of terminals of a network port, and a second current electrode;
a second current flow path including a first current electrode configured to couple to a second pair of terminals of the network port, and a second current electrode; and
a sense resistor including a first terminal coupled to the second electrodes of the first and second current flow paths, and a second terminal coupled to a power supply terminal; and
a gate drive circuit coupled to the first current flow path, the second current flow path, and the sense resistor, the gate drive circuit configured to control the first current flow path to provide a first current to the first pair of terminals and to control the second current flow path to selectively provide a second current to the second pair of terminals.

9. The port controller circuit of claim 8, wherein the gate drive circuit controls the first and second current flow paths to provide the first current and the second current to the first pair and the second pair of terminals substantially concurrently.

10. The port controller circuit of claim 8, wherein:
the first current flow path comprises a first transistor including a first current electrode coupled to the first pair of terminals, a control electrode coupled to the first output, and a second current electrode coupled to the first terminal of the shared sense resistor; and
a second current flow path comprises a second transistor including a first current electrode coupled to the second pair of terminals, a control electrode coupled to the second output, and a second current electrode coupled to the first terminal of the shared sense resistor.

11. The port controller of circuit of claim 8, further comprising a detection and classification circuit coupled to the gate drive circuit and to the shared sense resistor, the detection and classification circuit configured to perform Power over Ethernet powered device detection and classification operations.

12. The port controller circuit of claim 11, wherein the detection and classification circuit controls the gate drive circuit to provide the first current to the first pair of terminals to perform a powered device detection operation, and controls the gate drive circuit to provide the first current to the first pair of terminals to perform a powered device classification operation.

13. The port controller circuit of claim 11, further comprising a controller configured to communicate with a powered device coupled to the network port to negotiate whether to supply auxiliary power through the second pair of terminals.

14. The port controller circuit of claim 13, wherein the controller controls the gate drive circuit to provide the second current to the second pair of terminals to supply the auxiliary power.

15. The port controller circuit of claim 14, wherein the gate control circuit is configured to selectively control the first and second current flow paths to provide a total power exceeding approximately 25.5 watts to the first and second pairs of terminals.

16. The port controller circuit of claim 8, further comprising:
a plurality of current flow paths;
a plurality of network ports, each of the plurality of network ports coupled to a pair of current flow paths of the plurality of current flow paths;
a plurality of gate drive circuits, each gate drive circuit coupled to one of the pairs of current flow paths of the plurality of current flow paths; and
shared sense circuitry coupled to each of the plurality of gate drive circuits and configured to selectively detect an electrical parameter associated with a selected one of the plurality of ports, the shared sense circuitry configured to perform powered device detection and classification operations to detect and classify a powered device coupled to a selected one of the plurality of network ports.

17. A power sourcing equipment (PSE) device comprising:
a resistor including a first terminal, and a second terminal coupled to a power supply terminal;
a network port configurable to couple to a network cable and including a plurality of terminals, the plurality of terminals including a first pair of terminals and a second pair of terminals;
a first transformer including a primary winding and a secondary winding, the secondary winding including a first electrode coupled to a first terminal of the first pair of terminals, a center tap, and a second electrode coupled to a second terminal of the first pair of terminals;
a second transformer including a primary winding, and a secondary winding including a first electrode coupled to a first terminal of the second pair of terminals, a center tap, and a second electrode coupled to a second terminal of the first pair of terminals;

a first transistor including a first current electrode coupled to the center tap of the first transformer, a control terminal, and a second current electrode coupled to the first terminal of the resistor;

a second transistor including a first current electrode coupled to the center tap of the second transformer, a control terminal, and a second current electrode coupled to the first terminal of the resistor; and a gate drive circuit including a first output coupled to the control terminal of the first transistor, a second output couple to the control terminal of the second transistor, and a feedback input coupled to the first terminal of the resistor, the gate drive circuit to control the first transistor to couple a first current path to the center tap of the first transformer and to control the second transistor to selectively couple a second current path the center tap of the second transformer.

18. The PSE device of claim 17, wherein the gate drive circuit comprises:

a driver including an input coupled to the feedback input, and an output coupled to the first output; and an output switch including a first terminal coupled to the output of the driver, a second terminal coupled to the second output, and a control terminal responsive to a control signal to selectively couple the output of the driver to the second output.

19. The PSE device of claim 18, wherein the gate drive circuit further comprises:

a first clamp circuit including a first terminal coupled to the output of the driver, a second terminal coupled to the power supply terminal, and a control terminal;

a second clamp circuit including a first terminal coupled to the second output, a second terminal coupled to the power supply terminal, and a control terminal; and a controller configured to control the first and second clamp circuits to selectively disconnect the first and second gate terminals from the power supply terminal to bias the control terminals of the first and second transistors.

20. The PSE device of 17, further comprising:

sense circuitry coupled to the first terminal of the resistor and configured to detect a powered device coupled to the network port and classify power requirements of the powered device based on a current flowing through the first transistor; and wherein the gate drive circuit turns on the first transistor and turns off the second transistor during a powered device detection operation and during a powered device classification operation.

\* \* \* \* \*